(12) United States Patent
Ku et al.

(10) Patent No.: US 10,088,508 B2
(45) Date of Patent: Oct. 2, 2018

(54) WIRELESS POWER TRANSFER METHOD AND APPARATUS AND METHOD OF DETECTING RESONANT FREQUENCY USED IN WIRELESS POWER TRANSFER

(71) Applicants: Hyundai Motor Company, Seoul (KR); Konkuk University Industrial Cooperation Corp., Seoul (KR)

(72) Inventors: Hyun Chul Ku, Seoul (KR); Jae Yong Seong, Gyeonggi-do (KR); Won Shil Kang, Seoul (KR); Jong Gyun Lim, Seoul (KR)

(73) Assignees: Hyundai Motor Company, Seoul (KR); Konkuk University Industrial Cooperation Corp., Seoul (KR)

( * ) Notice: Subject to any disclaimer, the term of this patent is extended or adjusted under 35 U.S.C. 154(b) by 325 days.

(21) Appl. No.: 14/942,367

(22) Filed: Nov. 16, 2015

(65) Prior Publication Data
US 2016/0164303 A1 Jun. 9, 2016

(30) Foreign Application Priority Data
Dec. 3, 2014 (KR) .................. 10-2014-0172467

(51) Int. Cl.
| | |
|---|---|
| *G01R 23/00* | (2006.01) |
| *H02J 5/00* | (2016.01) |
| *H02J 7/02* | (2016.01) |
| *H02J 50/40* | (2016.01) |
| *H02J 50/12* | (2016.01) |
| *H02J 50/80* | (2016.01) |

(52) U.S. Cl.
CPC ........... *G01R 23/005* (2013.01); *H02J 7/025* (2013.01); *H02J 50/12* (2016.02); *H02J 50/40* (2016.02); *H02J 50/80* (2016.02)

(58) Field of Classification Search
None
See application file for complete search history.

(56) References Cited

U.S. PATENT DOCUMENTS

| | | | | |
|---|---|---|---|---|
| 2013/0057205 A1* | 3/2013 | Lee | ............. | H02J 5/005 320/108 |
| 2015/0115728 A1* | 4/2015 | Yamamoto | ............. | H02J 5/005 307/104 |

FOREIGN PATENT DOCUMENTS

| | | |
|---|---|---|
| JP | 2013-055879 A | 3/2012 |
| JP | 2012-095435 A | 5/2012 |
| KR | 2014-0060186 | 5/2014 |

\* cited by examiner

*Primary Examiner* — Jared Fureman
*Assistant Examiner* — Aqeel Bukhari
(74) *Attorney, Agent, or Firm* — Mintz Levin Cohn Ferris Glovsky and Popeo, P.C.; Peter F. Corless

(57) ABSTRACT

Disclosed herein are a wireless power transfer apparatus, a method for wireless power transfer and a method of detecting a resonant frequency used in a wireless power charging system or a wireless power transfer. The wireless power transfer apparatus includes a plurality of transmission coils, each of which transmits power to a receiver coil through magnetic resonance; a signal generator transmitting signals having different resonant frequencies to the plurality of transmission coils, the signal generator being connected to the plurality of transmission coils; and a feedback unit transferring information on amounts of powers which are respectively output by the plurality of transmission coils to the signal generator.

19 Claims, 7 Drawing Sheets

FIG. 8

WIRELESS POWER TRANSFER METHOD AND APPARATUS AND METHOD OF DETECTING RESONANT FREQUENCY USED IN WIRELESS POWER TRANSFER

CROSS-REFERENCE(S) TO RELATED APPLICATIONS

The present application claims priority of Korean Patent Application Number 10-2014-0172467 filed on Dec. 3, 2014, the entire contents of which application are incorporated herein for all purposes by this reference.

BACKGROUND OF THE INVENTION

Field of the Invention

Exemplary embodiments of the present invention relate to a wireless power transfer system and a method of detecting a resonant frequency used in a wireless power transfer, and particularly to a wireless power transfer apparatus having two or more transmission coils which are coupled with one receiver coil, a wireless power transfer method used to the apparatus, and a method of detecting a resonant frequency used in the wireless power transfer.

Description of Related Art

In recent years, technologies relating to plug-in hybrid vehicles and electric vehicles are growing rapidly. Part of or the entire driving force of such a vehicle is electric energy. In addition to a method of connecting to a charger in a wired way and putting a plug into the charger, a wireless charging method is being developed as a method of charging electric energy.

The wireless charging method is divided into an electromagnetic induction method and a resonance type method. In the case of the electromagnetic induction method, the distance capable of power transmission between a transmission coil buried in a parking lot and a receiver coil installed in a vehicle is very short. For this reason, the resonance type method is adopted instead of the electromagnetic induction method in order to secure a longer power transmission length, as disclosed in a related art.

Resonance or an echo refers to a phenomenon in which the amplitude of a vibration system is significantly increased in response to an external force that has the same number of vibrations as the natural frequency of the vibration system and that is periodically received. Resonance refers to a phenomenon generated in all the vibrations, such as a mechanical vibration and an electrical vibration. In general, when an external force capable of a vibration is applied to a vibration system, if the natural frequency of the vibration system is equal to the number of vibrations of the external force, the vibration of the vibration system becomes severe and the amplitude of the vibration system is increased. In the same principle, if a plurality of vibration bodies spaced apart from one another at specific distances is vibrated at the same frequency, the vibration bodies mutually resonate. At this time, resistance between the plurality of vibration bodies is decreased.

A wireless power transmission apparatus using multiple transmission coils has been disclosed as a method for improving charging efficiency and increasing output in the magnetic resonance type method. In the case of transmission unit including a plurality of transmission coils, interference between the plurality of transmission coils must be lowered, and high power transmission efficiency can be obtained when an influence between the plurality of transmission coils is the smallest.

A related art discloses a wireless power transmission apparatus including a plurality of power transmitters for transferring wireless power, wherein a wireless power reception apparatus includes a plurality of power receivers capable of receiving respective wireless power signals having different frequencies. The related art is intended to differently control the resonant frequencies of a plurality of power transmitters and to send power to different reception apparatuses, but is not intended to send power to a single power reception apparatus.

SUMMARY OF THE INVENTION

An embodiment of the present invention is directed to a wireless power charging system including a plurality of transmission coils using different frequencies, which is capable of improving power transmission efficiency and also reducing interference between the transmission coils, and a method of detecting a resonant frequency used in the wireless power charging system.

Another embodiment of the present invention is directed to a wireless power transfer apparatus having two or more transmission coils which are electromagnetically coupled to a receiver coil, a wireless power transfer method used to the apparatus, and a method of detecting a resonant frequency used in a wireless power transfer among the transmission coils and the receiver coil.

In accordance with an embodiment of the present invention, a wireless power charging system includes a transmission coil module configured to include a plurality of transmission coils and a receiver coil module configured to include a single receiver coil for receiving power through electron resonance with the transmission coils, wherein the plurality of transmission coils may have different resonant frequencies, and the receiver coil may have a resonant frequency different from the resonant frequencies of the transmission coils.

The resonant frequency of the receiver coil may be a resonant frequency between the lowest resonant frequency and the highest resonant frequency of the resonant frequencies of the plurality of transmission coils.

The Q factor of the receiver coil may be smaller than that of the plurality of transmission coils.

The plurality of transmission coils may be connected in parallel.

A coupling coefficient between each of the transmission coils and the receiver coil may be greater than a coupling coefficient between the plurality of transmission coils.

The wireless power charging system may further include a signal generator connected to the transmission coils and configured to determine specific resonant frequencies of the transmission coils.

The signal generator may be further configured to send a signal having a specific frequency to the transmission coils, receive the amounts of power output by the transmission coils in response to the transmitted signal, and determine the resonant frequencies of the transmission coils.

In accordance with another embodiment of the present invention, a method of detecting a resonant frequency used in a wireless power charging system may include sending a small signal having a specific frequency to a plurality of transmission coils, detecting the amounts of power respectively output by the plurality of transmission coils in response to the transmitted signal, and setting a frequency having the greatest amount of power of the detected amounts of power of the transmission coils as the resonant frequency of the transmission coils and sending a large signal having the resonant frequency to the transmission coils.

In accordance with another embodiment of the present invention, a wireless power transfer apparatus comprises a plurality of transmission coils, each of which transmits power to a receiver coil through magnetic resonance; a signal generator transmitting signals having different resonant frequencies to the plurality of transmission coils, the signal generator being connected to the plurality of transmission coils; and a feedback unit transferring information on amounts of powers which are respectively output by the plurality of transmission coils to the signal generator.

The signal generator may transmit a small signal to the each of the plurality of transmission coils before a frequency used for a maximum power transfer is set as a resonant frequency based on the information on amounts of powers. The small signal has a small amount of power in contrast with a normal-state power transfer of each of the plurality of transmission coils.

The signal generator further comprises a detector detecting a resonant frequency used for a maximum power transfer by each of the transmission coils on the basis of currents sensed by the feedback unit; a frequency changer changing a frequency of each of the transmission coils to the resonant frequency used for the maximum power; and an oscillator transmitting small signals having frequencies of which are changed to the plurality of the transmission coils before a frequency of the oscillator is changed to a resonant frequency of a maximum power, and transmitting large signals having a changed resonant frequency to each of the plurality of transmission coils after the frequency of the oscillator is changed to the resonant frequency of the maximum power.

In accordance with another embodiment of the present invention, a method for wireless power transfer, the method comprising: transmitting a signal having a specific frequency to a plurality of transmission coils, the transmission coils transmitting powers to a receiver coil through magnetic resonance; detecting amounts of powers which are respectively output by the plurality of transmission coils in response to the signal; detecting a resonant frequency used for a maximum power transfer by each of the plurality of transmission coils on the basis of the detected amounts of powers; changing a frequency of each of the transmission coils to the resonant frequency used for the maximum power; and transmitting power having a changed resonant frequency to each of the plurality of transmission coils.

In accordance with another embodiment of the present invention, a method of detecting a resonant frequency used in a wireless power transfer, the method comprising: sending a small signal having a specific frequency to a plurality of transmission coils, the small signal having a small amount of power in contrast with an amount of power in a normal-state power transfer of each of the plurality of transmission coils; detecting amounts of powers which are respectively output by the plurality of transmission coils in response to the small signal; and detecting a resonant frequency used for a maximum power transfer of each of the plurality of transmission coils on the basis of the detected amounts of powers.

The small amount of power of the small signal may be a half or less than an amount of power used for a normal-state power transfer between one of the transmission coils and the receiver coil during a predetermined time.

DESCRIPTION OF SPECIFIC EMBODIMENTS

Specific structural and functional descriptions of embodiments of the present invention disclosed in this specification or the application have been illustrated in order to merely describe the embodiments of the present invention. The embodiments of the present invention may be implemented in various forms and should not be construed as being limited to the embodiments described in this specification or application.

Specific embodiments of the present invention will be illustrated in the drawings and described in detail in this specification or application because the present invention may be modified in various ways and may have multiple embodiments. However, embodiments according to the concept of the present invention are not intended to be limited to the specific embodiments, and it is to be understood that the present invention includes all changes, equivalents, and substitutions that are included in the spirit and technical scope of the present invention.

Terms, such as the first and the second, may be used to describe a variety of elements, but the elements should not be limited by the terms. The terms are used to only distinguish one element from the other element. For example, a first element may be named a second element, and likewise a second element may be named a first element without departing from the scope of the present invention.

When it is said that one element is described as being "connected" to or "coupled" with the other element, the one element may be directly connected to or coupled with the other element, but it should be understood that a third element may be interposed between the two elements. In contrast, when it is said that one element is described as being "directly connected" to or "directly coupled" with the other element, it should be understood that a third element is not present between the two elements. Meanwhile, the same principle applies to other expressions, such as "between ~" and "just between ~" or "adjacent to ~" and "neighboring ~", which describe a relation between elements.

Terms used in this specification are used to describe only specific embodiments and are not intended to limit the present invention. An expression of the singular number should be understood to include plural expressions, unless clearly expressed otherwise in the context. It should be understood that in this application, terms, such as "include" or "have", are intended to designate the existence of described characteristics, numbers, steps, operations, elements, parts, or combination of them and understood, but are not intended to exclude the existence of one or more other characteristics, numbers, steps, operations, elements, parts, or a combination of them or the possibility addition of them.

All terms used herein, including technical or scientific terms, have the same meanings as those typically understood by those skilled in the art unless otherwise defined. Terms, such as ones defined in common dictionaries, should be construed as having the same meanings as those in the context of related technology and should not be construed as having ideal or excessively formal meanings unless clearly defined in this specification.

Hereinafter, some exemplary embodiments of the present invention are described in more detail with reference to the accompanying drawings. The same reference numerals in the drawings are used to denote the same elements throughout the drawings.

Figure 1:
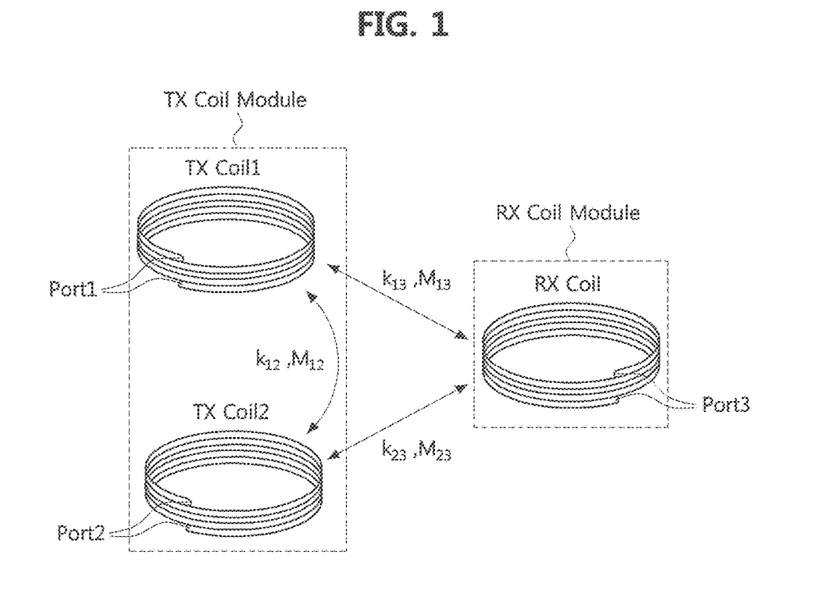
FIG. 1 is a diagram illustrating coupling coefficients between transmission coils and a receiver coil in a wireless power charging system or a wireless power transfer system in accordance with an embodiment of the present invention.

FIG. 1 is a diagram illustrating coupling coefficients between transmission coils and a receiver coil in a wireless power charging system in accordance with an embodiment of the present invention.

For example, FIG. 1 illustrates coupling coefficients between two transmission coils and a single receiver coil. A coupling coefficient between a first transmission coil TX Coil1 and a receiver coil RX Coil may be represented by k13, a coupling coefficient between a second transmission coil TX Coil2 and the receiver coil RX Coil may be represented by k23, and a coupling coefficient between the first transmission coil TX Coil1 and the second transmission coil TX Coil2 may be represented by k12. Furthermore, mutual inductance between the first transmission coil TX Coil1 and the receiver coil RX Coil may be represented by M13, mutual inductance between the second transmission coil TX Coil2 and the receiver coil RX Coil may be represented by M23, and mutual inductance between the first transmission coil TX Coil1 and the second transmission coil TX Coil2 may be represented by M12.

Coupling may be divided into over-coupling, critical coupling, and under-coupling depending on the amount of a coupling coefficient. In general, high power transmission efficiency may be obtained in over-coupling and critical coupling between a transmission coil and a receiver coil. A single resonant frequency is used in critical coupling between a transmission coil and a receiver coil, but in over-coupling between a transmission coil and a receiver coil, high power transmission efficiency may be obtained in two resonant frequencies. The reason for this is that in the over coupling, the coupling coefficient has a double-humped resonance characteristic because it is 0.5 or more.

The coupling coefficient varies depending on the distance between a transmission coil and the receiver coil. That is, if the distance between the transmission coil and the receiver coil is changed depending on a charging environment, the coupling coefficient is also changed.

Figure 2A:
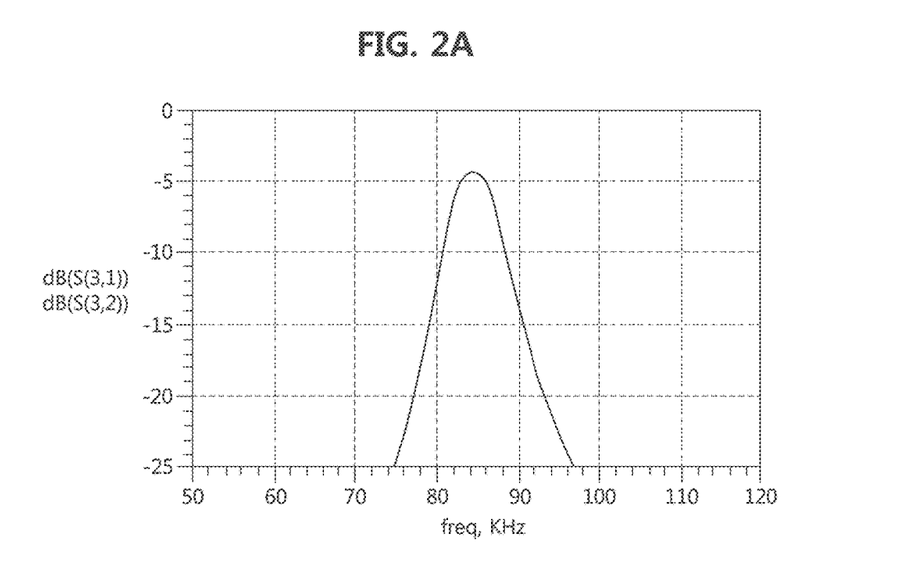
FIGS. 2A and 2B are graphs illustrating S parameter values when the coils illustrated in FIG. 1 have the same resonant frequency.
Figure 2B:
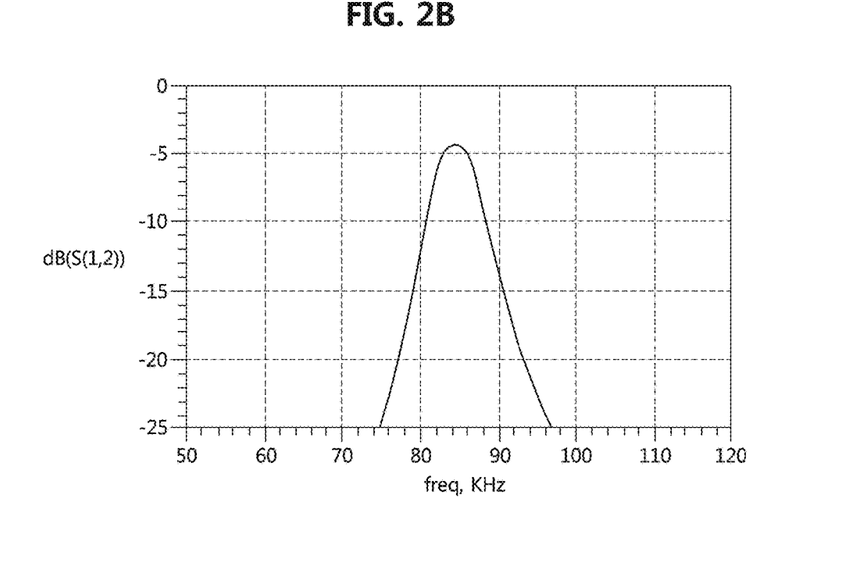

FIGS. 2A and 2B are graphs illustrating S parameter values when the coils illustrated in FIG. 1 have the same resonant frequency. The S parameter refers to a scattering parameter and means a ratio of an input voltage to an output voltage in a frequency distribution. For example, S(3, 1) refers to a ratio of voltage input at 1 to voltage output at 3. 1 means the first transmission coil TX Coil1, 2 means the second transmission coil TX Coil2, and 3 means the receiver coil RX Coil.

From FIGS. 2A and 2B, it may be seen that S(3, 1) and S(3, 2) have the same value. It may also be seen that S(1, 2) has the same value. S(1, 2) means a ratio of voltage, input at the second transmission coil TX Coil2, to voltage output at the first transmission coil TX Coil1. That is, S(1, 2) refers to power transmission between the two transmission coils.

That is, it may be seen that if all the first transmission coil, the second transmission coil, and the receiver coil have the same resonant frequency, the amount of power transmitted from the first transmission coil to the receiver coil, the amount of power transmitted from the second transmission coil to the receiver coil, and the amount of power transmitted from the second transmission coil to the first transmission coil are the same. In this case, the transmission of power to the receiver coil may be hindered because an influence between the transmission coils is increased.

Figure 3A:
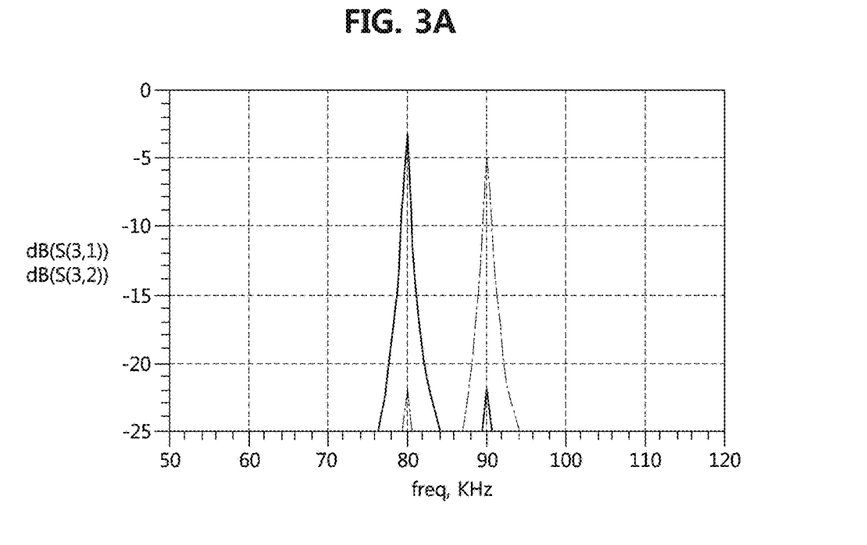
FIGS. 3A and 3B are graphs illustrating S parameter values when the coils illustrated in FIG. 1 have different resonant frequencies.
Figure 3B:
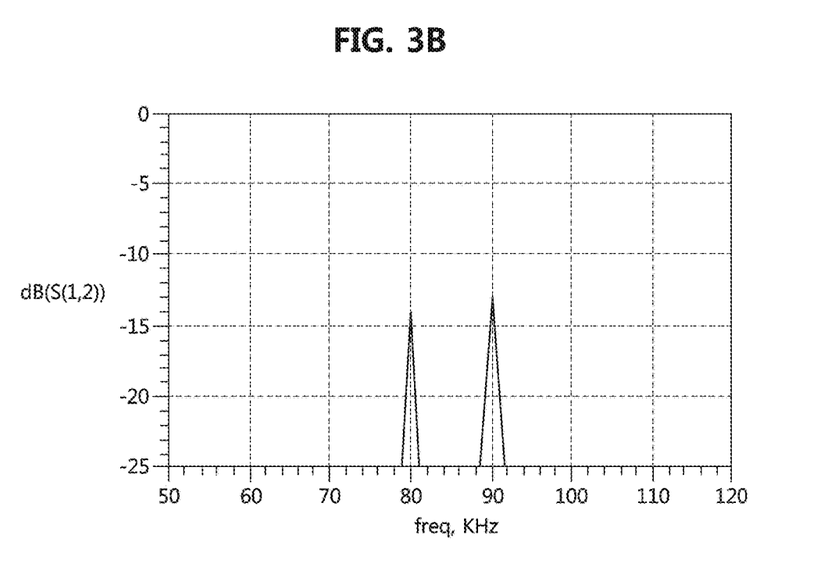

FIGS. 3A and 3B are graphs illustrating S parameter values when the coils illustrated in FIG. 1 have different resonant frequencies.

Referring to FIGS. 3A and 3B, the resonant frequency of the first transmission coil is set to 80 KHz, and the resonant frequency of the second transmission coil is set to 90 KHz. Furthermore, the resonant frequency of the receiver coil is set to 85 KHz. The resonant frequencies are only illustrative, and the present invention is not limited to the numerical values. Accordingly, it may be seen that S(3, 1), that is, the amount of power transmitted from the first transmission coil to the receiver coil, is great in the resonant frequency of 80 KHz and S(3, 2), that is, the amount of power transmitted from the second transmission coil to the receiver coil, is great in the resonant frequency of 90 KHz. In contrast, it may also be seen that in the resonant frequencies of 80 KHz and 90 KHz, a relatively small amount of power is transmitted from the second transmission coil to the first transmission coil. A small signal which has the relatively small amount of power may have a half or less than an amount of power in a normal state power transfer of each of the transmission coils.

In this case, in order to reduce an influence between the transmission coils, the Q factor of the transmission coils may be increased. Accordingly, the influence S(1, 2) between the transmission coils may be reduced.

The wireless power charging system includes a receiver coil module including a receiver coil for receiving power through electron resonance with transmission coils. The receiver coil has a resonant frequency different from that of the transmission coils.

The resonant frequency of the receiver coil may be between the lowest resonant frequency and the highest resonant frequency of the resonant frequencies of a plurality of transmission coils. The receiver coil may have a lower Q factor than the plurality of transmission coils. Furthermore, a coupling coefficient between the transmission coils and the receiver coil is greater than a coupling coefficient between the plurality of transmission coils.

Figure 4:
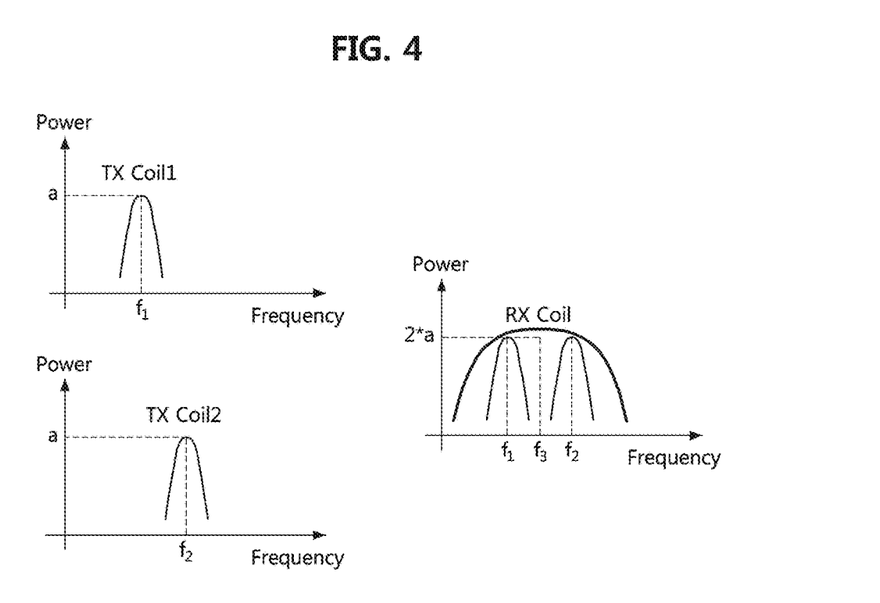
FIG. 4 is a diagram illustrating examples of the Q factor and resonant frequencies of the coils illustrated in FIG. 1.

FIG. 4 is a diagram illustrating examples of the Q factor and resonant frequencies of the coils illustrated in FIG. 1.

Referring to FIG. 4, assuming that the resonant frequency of the first transmission coil Tx Coil1 is f1 and the resonant frequency of the second transmission coil Tx Coil2 is f2, the resonant frequency of the receiver coil Rx Coil is f3. The entire transmission waveform having the plurality of resonant frequencies may be covered because the Q factor of the receiver coil is relatively smaller than that of the transmission coils. That is, in order to receive power in two or more resonant frequencies, the Q factor of the receiver coil is relatively smaller than that of the transmission coils. In this case, power transmitted by each of the transmission coils may be maximized in the receiver coil.

The Q factor is a quality factor, and a bandwidth in which a tuning circuit will operate is determined by the Q factor. The bandwidth is defined as the width of a frequency between two frequencies when current amplitude is reduced by '1/root2' times a maximum value. The bandwidth is represented by a resonant frequency/Q factor. That is, the bandwidth is narrower when the Q factor is great than when the Q factor is small.

Figure 5:
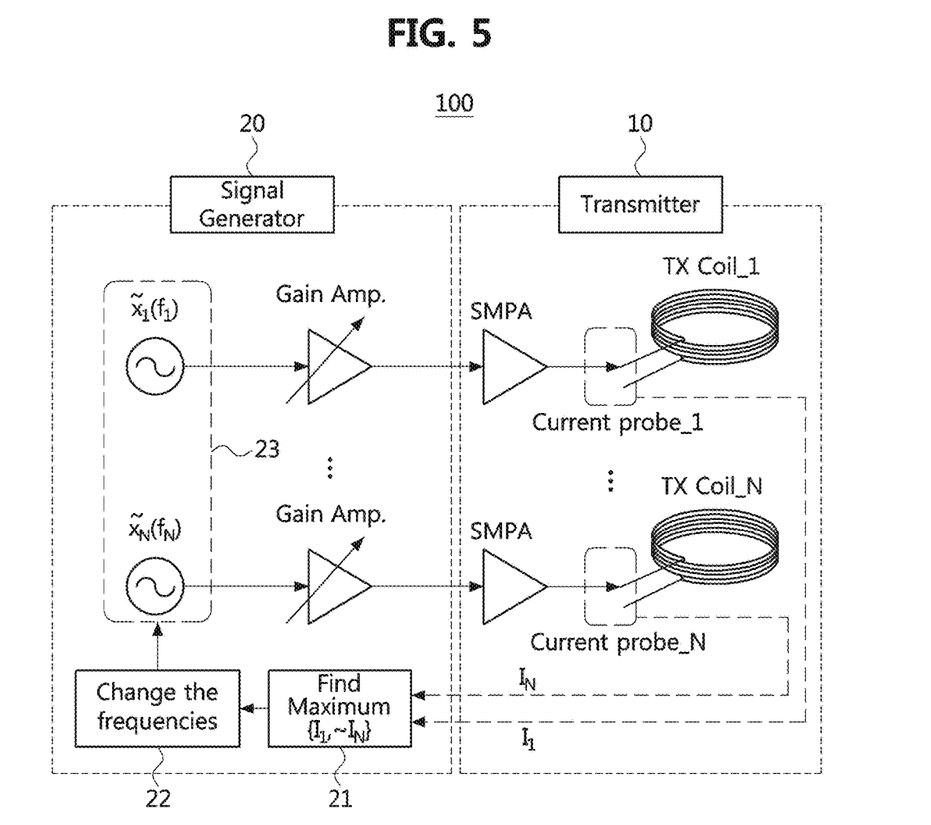
FIG. 5 is a schematic diagram illustrating a transmission unit that forms the wireless power charging system in accordance with an embodiment of the present invention and that includes multiple transmission coils including a frequency change unit.

FIG. 5 is a schematic diagram illustrating a transmission unit that forms the wireless power charging system in accordance with an embodiment of the present invention and that includes multiple transmission coils including a frequency change unit.

The transmission unit 100 may include a transmitter 10 configured to include transmission coils Tx Coil_1 to Tx Coil_N, switch mode power amplifiers (SMPAs), and current probes Current probe_1 to Current probe_N capable of sense the amounts of current of the respective transmission coils Tx Coil_1 to Tx Coil_N and a signal generator 20 configured to generate a signal and send the signal to the transmitter 10. The current probes may be at least a part of a feedback unit which provides detected currents to the signal generator.

The signal generator 20 may send a small signal having a specific frequency to the transmission coils, may receive the amounts of power fed back by the transmission coils in response to the small signal, and may determine the resonant frequencies of the transmission coils.

For example, the signal generator 20 may find a maximum value in the amounts of current detected by the current probes and supply the transmitter 10 with a large signal having a resonant frequency corresponding to the maximum value. That is, the signal generator 20 may include a detector 21 which detects a resonant frequency of maximum power on the basis of the sensing currents, a frequency changer 22 which changes a frequency of each of the transmit coils to the resonant frequency of the maximum power, and an oscillator 23 which transmits small signals having frequencies of which are changed to the plurality of transmission coils before a frequency of the oscillator is changed to the resonant frequency of the maximum power, and transmits large signals having a changed resonant frequency to each of the plurality of transmit coils after the resonant frequency is changed to the resonant frequency of the maximum power. The large signal may be a signal or power when wireless power transfer is normally executed among the transmitting coils and the receiver coil.

As described above, the transmission unit 100 may include the transmitter 10 configured to include the plurality of transmission coils and the signal generator 20 configured to determine specific resonant frequencies of the transmission coils. The plurality of transmission coils has different resonant frequencies. Furthermore, the plurality of transmission coils is connected in parallel.

Figure 6:
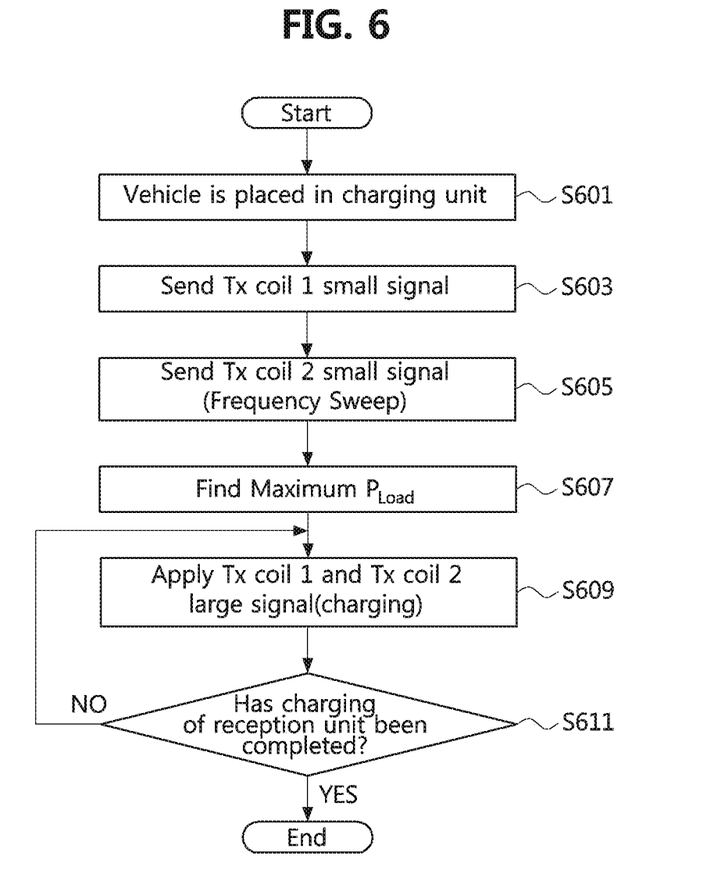
FIG. 6 is a flowchart illustrating a method of finding an optimal resonant frequency used in the wireless power charging system in accordance with an embodiment of the present invention.
Figure 7:
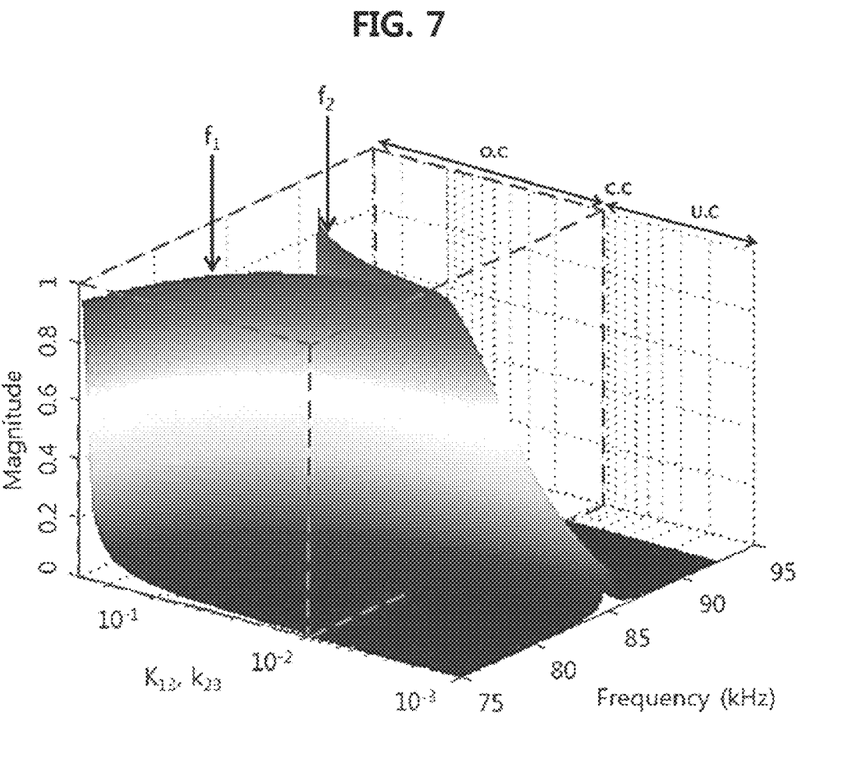
FIG. 7 is a diagram illustrating a frequency characteristic according to the coupling coefficients between the coils illustrated in FIG. 1.

FIG. 6 is a flowchart illustrating a method of finding an optimal resonant frequency using the wireless power charging system in accordance with an embodiment of the present invention, and FIG. 7 is a diagram illustrating a frequency characteristic according to the coupling coefficients between the coils illustrated in FIG. 1.

First, when a vehicle is placed over the transmission unit 100 at step S601, a small signal generated by the signal generator 20 is transmitted to the transmission coils at steps S603 and S605. That is, the small signal having a varying frequency is transmitted to the plurality of transmission coils. A frequency when power output in response to the small signal is a maximum is detected at step S607. Furthermore, a large signal having a resonant frequency when the output power is a maximum may be applied to the transmission coils at step S609. Power according to the large signal is transmitted to the receiver coil at step S611.

Since different resonant frequencies are set in the transmission coils, they are found and a large signal having such a resonant frequency is transmitted to each transmission coil, thereby being capable of sending power to the receiver coil. From FIG. 7, it may be seen that the amount of power output is a maximum in an over-coupling region in response to a signal having two resonant frequencies.

Figure 8:
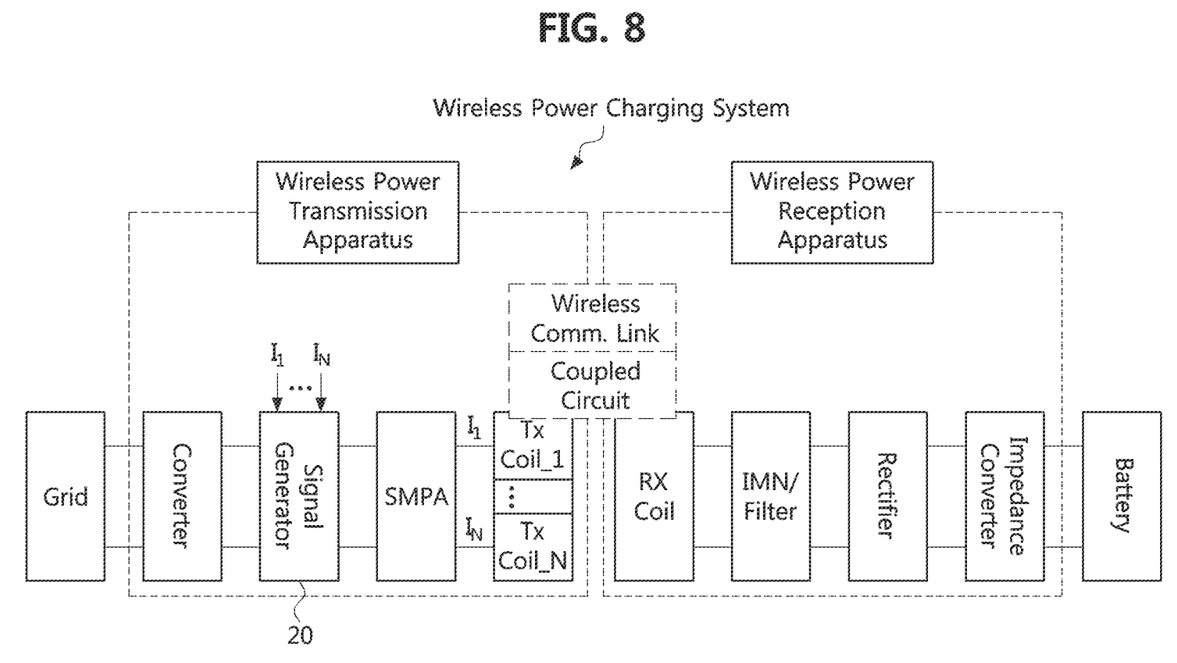
FIG. 8 is a diagram illustrating a wireless power transfer system in accordance with an embodiment of the present invention.

In accordance with the wireless power charging system or the wireless power transfer system shown in FIG. 8 according to an embodiment of the present invention, interference between transmission coils can be minimized and power transmission efficiency can be improved using two or more parallel transmission coils. In FIG. 8, a converter may include AC-DC converter, DC-AC converter, DC-DC converter, IMN, a filter or the combination thereof. A term of IMN refer to an impedance matching network.

Furthermore, the amount of power to be processed by each transmission coil can be reduced using a plurality of transmission coils. Furthermore, a power consumption problem that may occur due to a high coupling coefficient between transmission coils can be solved.

Although the present invention has been described in connection with the embodiments illustrated in the drawings, the embodiments are only illustrative. Those skilled in the art to which the present invention pertains may understand that various other modifications and equivalent embodiments are possible. Accordingly, the true scope of the present invention should be determined by the technical spirit of the following claims.

What is claimed is:

1. A wireless power transfer apparatus comprises:
   a plurality of transmission coils, each of which transmits power to a receiver coil through magnetic resonance;
   a signal generator transmitting signals having different resonant frequencies to the plurality of transmission coils, the signal generator being connected to the plurality of transmission coils; and
   a feedback unit transferring information on amounts of powers which are respectively output by the plurality of transmission coils to the signal generator,
   wherein each Q factor of the plurality of transmission coils is greater than a O factor of the receiver coil.

2. The apparatus according to claim 1, wherein the signal generator transmits a small signal to the each of the plurality of transmission coils before a frequency used for a maximum power transfer is set as a resonant frequency based on the information on amounts of powers, the small signal having a small amount of power in contrast with a normal-state power transfer of each of the plurality of transmission coils.

3. The apparatus according to claim 1, wherein the plurality of transmission coils are connected in parallel.

4. The apparatus according to claim 3, wherein coupling coefficients between respective transmission coils and the receiver coil are greater than coupling coefficients among the respective transmission coils.

5. The apparatus according to claim 3, wherein the plurality of the transmission coils transfer power in two resonant frequencies to the receiver coil.

6. The apparatus according to claim 1, wherein the signal generator further comprises:
   a detector detecting a resonant frequency used for a maximum power transfer by each of the transmission coils on the basis of currents sensed by the feedback unit,
   a frequency changer changing a frequency of each of the transmission coils to the resonant frequency used for the maximum power, and
   an oscillator transmitting small signals having frequencies of which are changed to the plurality of the transmission coils before a frequency of the oscillator is changed to the resonant frequency of the maximum power, and transmitting large signals having a changed resonant frequency to each of the plurality of transmission coils after the frequency of the oscillator is changed to the resonant frequency of the maximum power.

7. A method for wireless power transfer, the method comprising:
   transmitting a signal having a specific frequency to a plurality of transmission coils, the transmission coils transmitting powers to a receiver coil through magnetic resonance;
   detecting amounts of powers which are respectively output by the plurality of transmission coils in response to the signal;
   detecting a resonant frequency used for a maximum power transfer by each of the plurality of transmission coils on the basis of the detected amounts of powers;
   changing a frequency of each of the transmission coils to the resonant frequency used for the maximum power; and
   transmitting power having a changed resonant frequency to each of the plurality of transmission coils,
   wherein the resonant frequency is a frequency that reduces interference between the plurality of transmission coils.

8. The method according to claim 7, wherein the sending a signal transfers a small signal to the plurality of transmission coils while changing a frequency of the small signal, the small signal having a small amount of power in contrast with an amount of power in a normal-state power transfer of each of the plurality of transmission coils.

9. The method according to claim 7, wherein each of Q factors of the plurality of transmission coils is greater than a Q factor of the receiver coil.

10. The method according to claim 7, wherein the plurality of transmission coils are connected in parallel.

11. The method according to claim 10, wherein coupling coefficients between respective transmission coils and the receiver coil are greater than coupling coefficients among the respective transmission coils.

12. The method according to claim 10, wherein the plurality of transmission coils are coupled to the receiver coil in over-coupling.

13. A method of detecting a resonant frequency used in a wireless power transfer, the method comprising:
   transmitting a small signal having a specific frequency to a plurality of transmission coils, the small signal having a small amount of power in contrast with an amount of power in a normal-state power transfer of each of the plurality of transmission coils;
   detecting amounts of powers which are respectively output by the plurality of transmission coils in response to the small signal; and
   detecting a resonant frequency used for a maximum power transfer of each of the plurality of transmission coils on the basis of the detected amounts of powers,
   wherein the resonant frequency is a frequency that reduces interference between the plurality of transmission coils.

14. The method according to claim 13, wherein the small signal is transmitted to the plurality of transmission coils while changing a frequency of the small signal.

15. The method according to claim 14, wherein the small amount of power of the small signal is a half of or less than an amount of power used for a normal-state power transfer between one of the transmission coils and the receiver coil during a predetermined time.

16. The method according to claim 14, wherein each of Q factors of the plurality of transmission coils is greater than a Q factor of the receiver coil.

17. The method according to claim 16, wherein coupling coefficients between respective transmission coils and the receiver coil are greater than coupling coefficients among the respective transmission coils.

18. The method according to claim 17, wherein the detecting a resonant frequency detects two resonant frequencies used for a maximum power transfer of the plurality of the transmission coils.

19. The method according to claim 17, wherein the coupling coefficients between each of the plurality of the transmission coils and the receiver coil are 0.5 or more, respectively.

* * * * *